(12) United States Patent
Zhang et al.

(10) Patent No.: US 8,888,443 B2
(45) Date of Patent: Nov. 18, 2014

(54) FAN ASSEMBLY

(75) Inventors: Xiang Zhang, Wuhan (CN); Heng Tao, Wuhan (CN); Chao Geng, Wuhan (CN)

(73) Assignees: Hong Fu Jin Precision Industry (WuHan) Co., Ltd., Wuhan (CN); Hon Hai Precision Industry Co., Ltd., New Taipei (TW)

( * ) Notice: Subject to any disclaimer, the term of this patent is extended or adjusted under 35 U.S.C. 154(b) by 348 days.

(21) Appl. No.: 13/426,743

(22) Filed: Mar. 22, 2012

(65) Prior Publication Data

US 2013/0004303 A1    Jan. 3, 2013

(30) Foreign Application Priority Data

Jun. 29, 2011    (CN) .......................... 2011 1 0178478

(51) Int. Cl.
  *F04D 29/70*    (2006.01)
  *H05K 7/20*    (2006.01)

(52) U.S. Cl.
  CPC .................................. *H05K 7/20172* (2013.01)
  USPC .................................... 415/121.2; 415/213.1

(58) Field of Classification Search
  USPC .......................... 415/182.1, 213.1, 214.1, 232
  See application file for complete search history.

(56) References Cited

U.S. PATENT DOCUMENTS

| | | | |
|---|---|---|---|
| 6,826,048 B1* | 11/2004 | Dean et al. | 361/695 |
| 7,494,408 B2* | 2/2009 | Chen et al. | 454/184 |
| 2004/0247431 A1* | 12/2004 | Chen et al. | 415/182.1 |
| 2012/0087790 A1* | 4/2012 | Zeng et al. | 415/213.1 |

* cited by examiner

*Primary Examiner* — Edward Look
*Assistant Examiner* — William Grigos
(74) *Attorney, Agent, or Firm* — Novak Druce Connolly Bove + Quigg LLP

(57) ABSTRACT

A fan assembly includes a case, a bracket and a fan module. The cage includes a ventilation plate. An installation portion and a positioning post are located on the ventilation plate. The fan module is secured to the ventilation plate and includes a bracket and a fan secured to the bracket. The bracket includes a body, a first sidewall, and a second sidewall. The first and second sidewalls are located on opposite sides of the body. The first sidewall defines a first receiving slot and a first positioning hole. The second sidewall defines a second receiving slot and a second positioning hole. The first positioning hole is aligned with the second positioning hole. An area of the first receiving slot is larger than that of the second receiving slot. The positioning post is engaged in the positioning hole. The installation portion is received in the first receiving slot.

20 Claims, 6 Drawing Sheets

FAN ASSEMBLY

BACKGROUND

1. Technical Field

The present disclosure relates to fan assemblies, and more particularly to a fan assembly with a mistake-proof design.

2. Description of Related Art

A fan assembly is provided in an electronic device for cooling electronic components. However, the fan assembly can be incorrectly installed if care is not taken during the installation. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
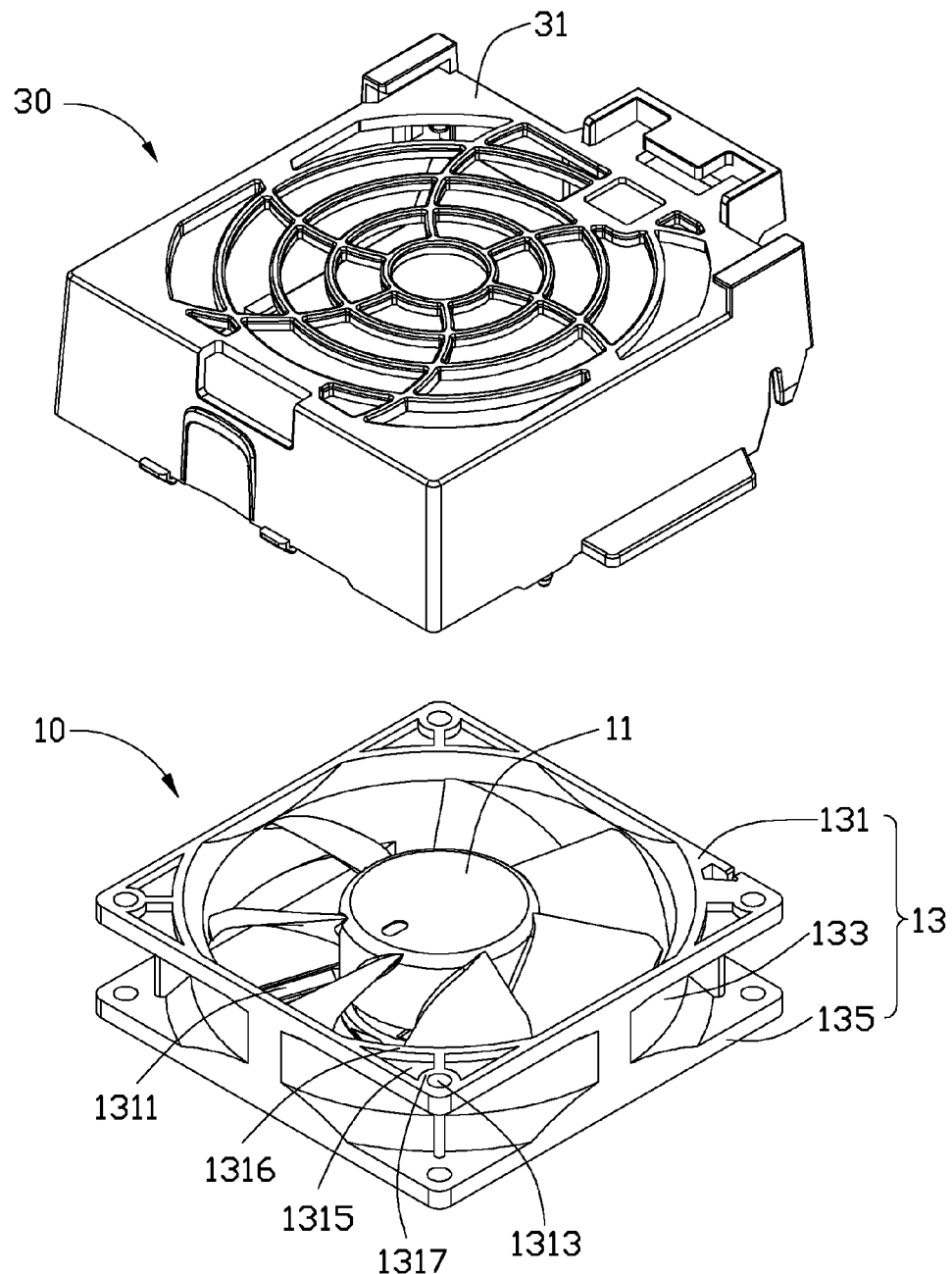
FIG. 1 is an exploded, isometric view of one an embodiment of a fan assembly.
Figure 2:
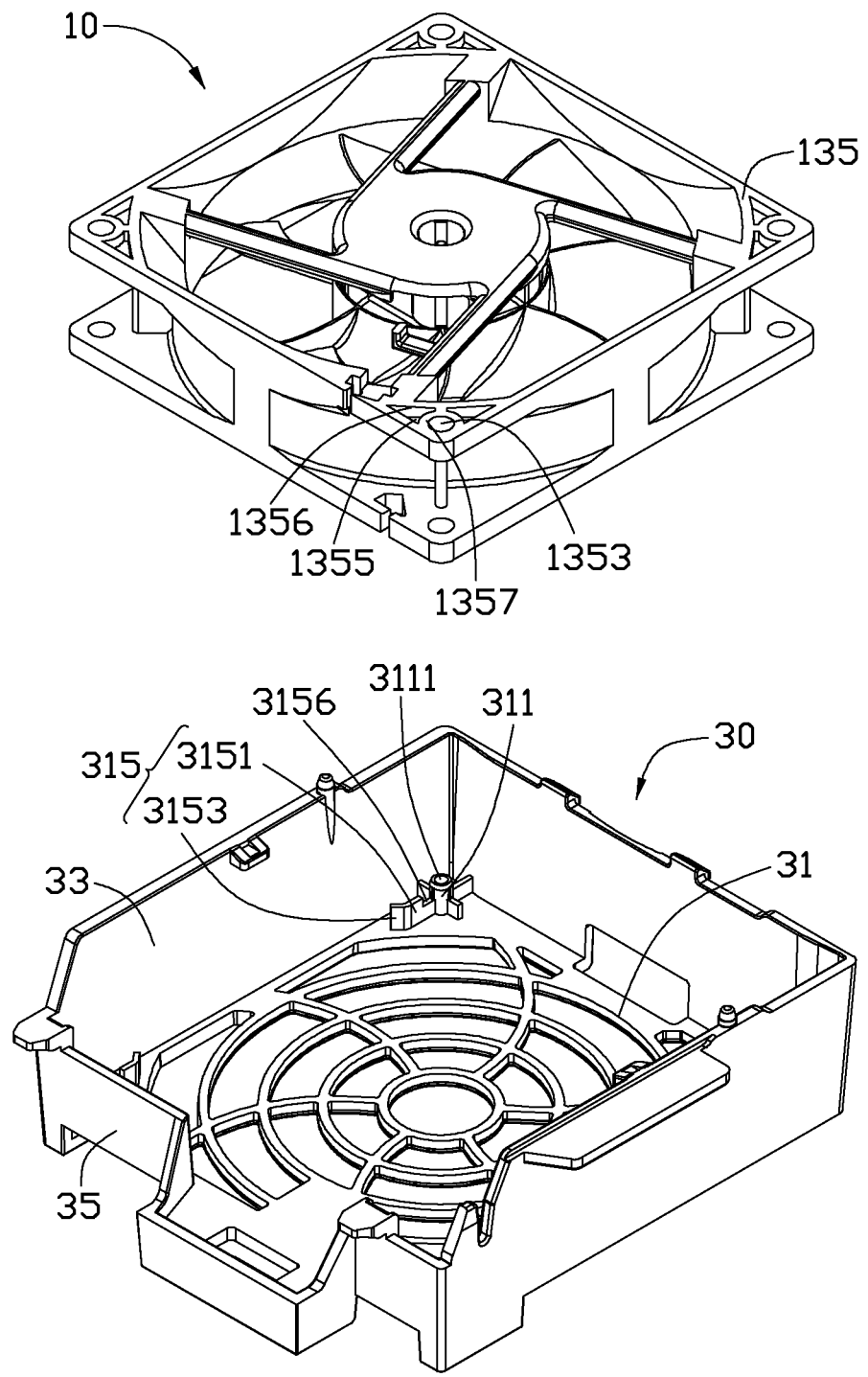
FIG. 2 is similar to FIG. 1, but viewed from a different aspect.

FIG. 1 and FIG. 2, show a fan assembly in accordance with one embodiment including a fan module 10 and a cage 30.

The fan module 10 includes a bracket 13 and a fan 11. The bracket 13 includes a body 133, a first sidewall 131, and a second sidewall 135. The first and the second sidewalls 131, 135 are located on opposite sides of the body 133. A size of the first sidewall 131 is substantially equal to that of the second sidewall 135. The fan 11 is secured to the second sidewall 135 and received in the body 133. An air inlet 1311 is defined in the first sidewall 131. An air outlet 1351 is defined in the second sidewall 135. In one embodiment, the air inlet 1311 and the air outlet 1351 are round. A diameter of the air inlet 1311 is smaller than that of the air outlet 1351. A first positioning hole 1313 and a first receiving slot 1315 are defined in each corner of the first sidewall 131. The first receiving slot 1315 is located between the air inlet 1311 and the first positioning hole 1313. The first receiving slot 1315 and the air inlet 1311 are separated by a first blocking piece 1316. The first receiving slot 1315 and the first positioning hole 1313 are separated by a first positioning piece 1317. The first blocking piece 1316 surrounds the air inlet 1311. In one embodiment, the first blocking piece 1316 is round.

A second positioning hole 1353 and a second receiving slot 1355 are defined in each corner of the second sidewall 135. The second receiving slot 1355 is located between the air outlet 1351 and the second positioning hole 1353. The second receiving slot 1355 and the air outlet 1351 are separated by a second blocking piece 1356. The second receiving slot 1355 and the second positioning hole 1353 are separated by a second positioning piece 1357. The second blocking piece 1356 surrounds the air outlet 1351. In one embodiment, the second blocking piece 1356 is round. A diameter of the first blocking piece 1316 is smaller than that of the second blocking piece 1356. An area of the first receiving slot 1315 is larger than that of the second receiving slot 1355. A size of the first positioning hole 1313 is equal to that of the second positioning hole 1353. The first positioning hole 1313 is aligned with the second positioning hole 1353.

The cage 30 includes a ventilation plate 31, two first side plates 33 and two second side plates 35. The two first side plates 33 and the two second side plates 35 extend from the ventilation plate 31. In one embodiment, the two first side plates 33 are substantially parallel to each other, and the two second side plates 35 are substantially parallel to each other. A positioning post 311 is located on each corner of the ventilation plate 31. The positioning post 311 defines a locking hole 3111. An installation portion 315 extends from the positioning post 311 towards the second side plate. The installation portion 315 includes an installation piece 3151 and a restricting piece 3153. The installation piece 3151 extends from the positioning post 311. The restricting piece 3153 obliquely extends from the installation piece 3151. The installation piece 3151 is substantially parallel to the two first side plates 33 and defines a cutout 3156. The restricting piece 3153 extends towards one of the two first side plates 33, which is adjacent to the installation piece 3151.

Figure 3:
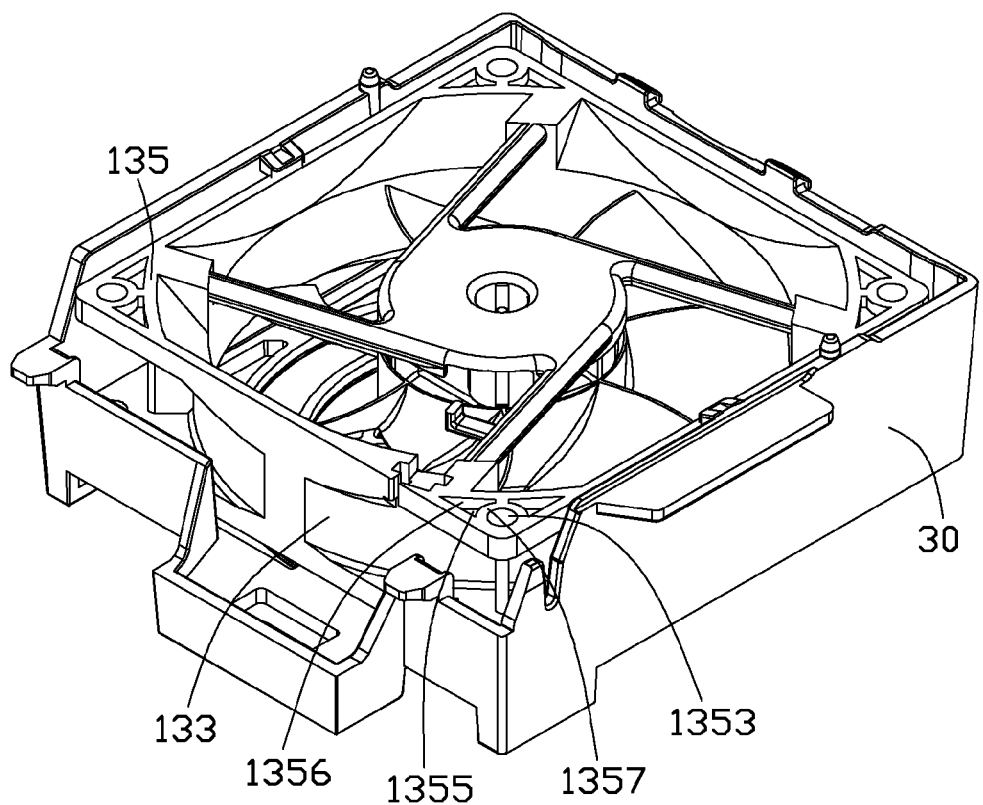
FIG. 3 is an isometric view of a correctly assembled fan assembly of FIG. 1.
Figure 4:
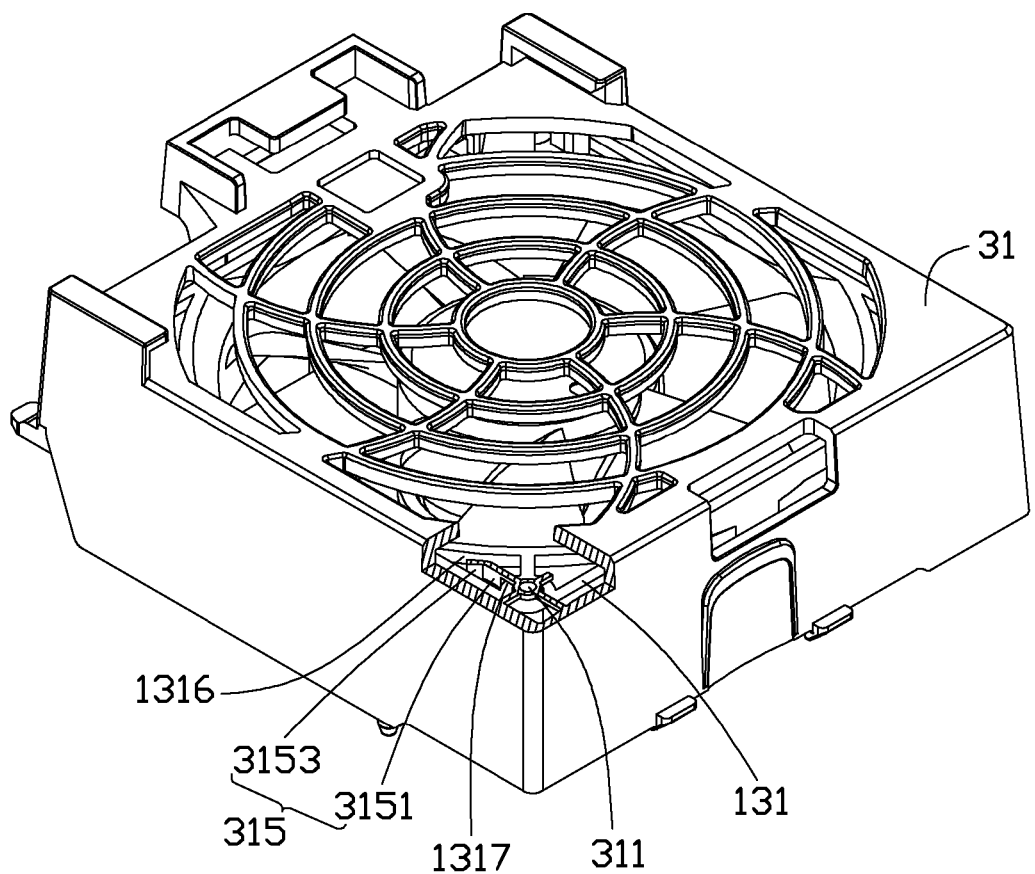
FIG. 4 is a cutaway view of FIG. 3.

Referring also to FIG. 3 and FIG. 4, in assembly, if the first sidewall 131 faces the ventilation plate 31 and is moved towards the ventilation plate 31, the positioning post 311 is inserted into the first positioning hole 1313, the installation portion 315 is received in the first receiving slot 1315, the restricting piece 3153 abuts an outer surface of the first blocking piece 1316 facing the first receiving slot 1315, the first positioning piece 1317 is engaged in the cutout 3156, and the first sidewall 131 abuts the ventilation plate 31. In this situation, the fan module 10 is correctly placed on the cage 30. A locking member (not shown), such as a screw, is inserted into the second positioning hole 1353 and the first positioning hole 1313, so the fan module 10 is secured to the cage 30.

Figure 5:
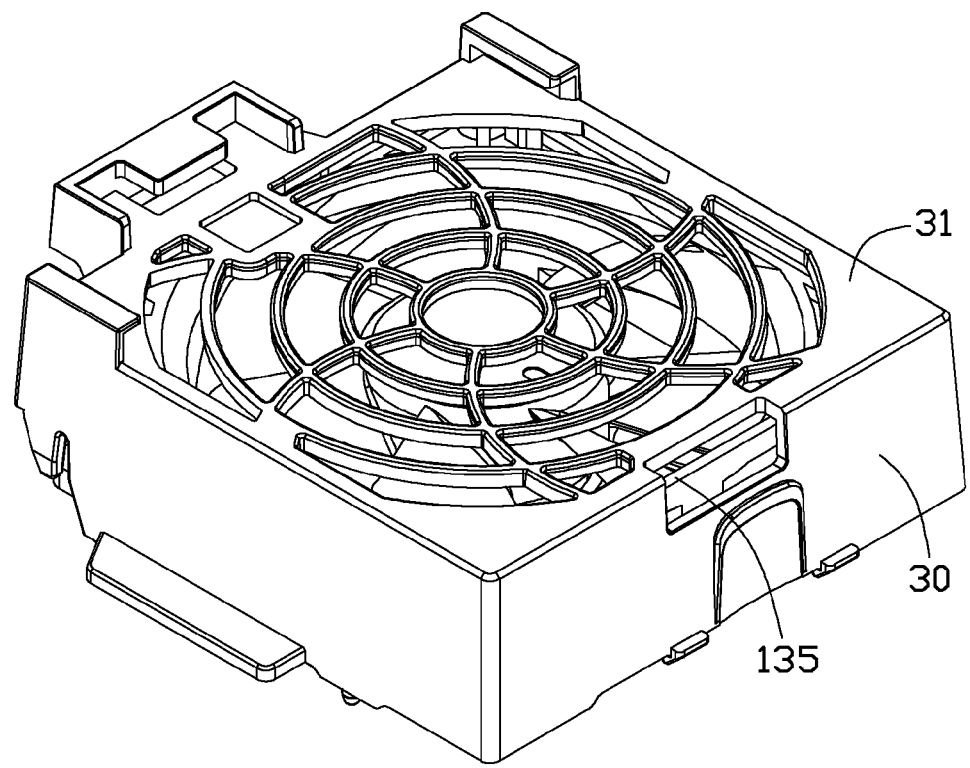
FIG. 5 is an isometric view of an incorrectly assembled fan assembly of FIG. 1.
Figure 6:
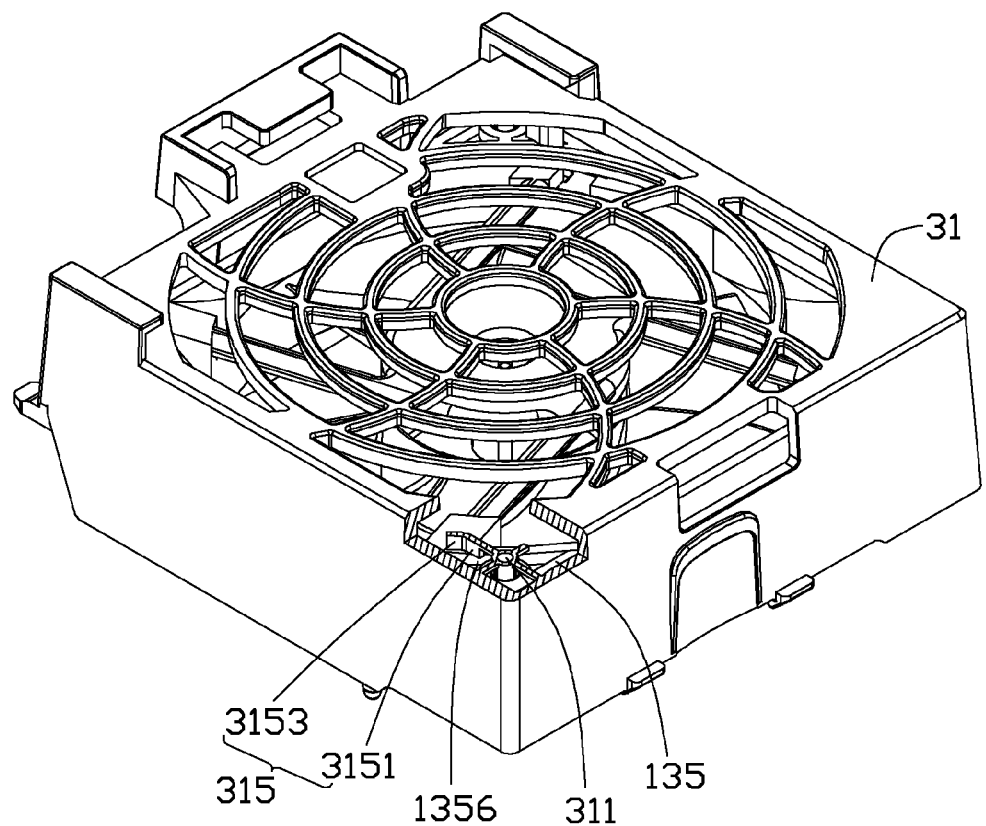
FIG. 6 is a cutaway view of FIG. 5.

Referring also to FIG. 5 and FIG. 6, in assembly, if the second sidewall 135 faces the ventilation plate 31 and is moved towards the ventilation plate 31, the second blocking piece 1356 is blocked by the installation piece 3151, the installation piece 3151 abuts a top surface of the second blocking piece 1356 and cannot be received in the second receiving slot 1355. Thus, the positioning post 311 cannot be inserted into the second positioning hole 1353, and the second sidewall 135 cannot abut the ventilation plate 31. In this situation indicates that the fan module 10 is incorrectly placed on the cage 30.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A fan assembly comprising:
a cage comprising a ventilation plate, and an installation portion and a positioning post located on the ventilation plate; and
a fan module secured to the ventilation plate, the fan module comprising:
a bracket comprising a body, a first sidewall, and a second sidewall, each of the first sidewall and the second sidewall located on an opposite side of the body, the first sidewall defining a first receiving slot and a first positioning hole, and the second sidewall defining a second receiving slot and a second positioning hole; and
a fan received in the body and secured to the second sidewall;
wherein the first positioning hole is aligned with the second positioning hole, and an area of the first receiving slot is larger than an area of the second receiving slot; the positioning post is engaged in the first positioning hole, and the installation portion is received in the first receiving slot.

2. The fan assembly of claim 1, wherein the first side wall is substantially parallel to the second sidewall and the ventilation plate.

3. The fan assembly of claim 1, wherein a first blocking piece and a first positioning piece extend from the first sidewall, the first receiving slot and the first positioning hole are separated by the first positioning piece, and the first receiving slot is located between the first blocking piece and the first positioning piece; and the installation portion abuts an outer surface of the first blocking piece facing the first positioning piece.

4. The fan assembly of claim 3, wherein the installation portion comprises an installation piece and a restricting piece, the installation piece extends from the positioning post, and the restricting piece abuts the outer surface of the first blocking piece.

5. The fan assembly of claim 4, wherein the restricting piece defines a cutout, and the first positioning piece is engaged in the cutout.

6. The fan assembly of claim 4, wherein the cage further comprises a first side plate and a second side plate, the first side plate and the second side plate are substantially perpendicular to the ventilation plate and parallel to each other, and the installation piece is substantially parallel to the first side plate.

7. The fan assembly of claim 6, wherein the restricting piece obliquely extends from the installation piece towards the second side plate.

8. The fan assembly of claim 6, wherein a second blocking piece and a second positioning piece extend from the second sidewall, the second receiving slot and the second positioning hole is separated by the second positioning piece, and the second receiving slot is located between the second blocking piece and the second positioning piece.

9. The fan assembly of claim 8, wherein the first blocking piece and the second blocking piece are round, and a diameter of the first blocking piece is smaller than a diameter of the second blocking piece.

10. The fan assembly of claim 8, wherein the first sidewall defines an air inlet, the second sidewall defines an air outlet, the first blocking piece surrounds the air inlet, and the second blocking piece surrounds the air outlet; the air inlet and the air outlet are round, and a diameter of the air inlet is smaller than a diameter of the air outlet.

11. A fan assembly comprising:
a cage comprising an ventilation plate, and an installation portion and a positioning post located on the ventilation plate; and
a fan module secured to the ventilation plate, the fan module comprising:
a bracket comprising a body, a first sidewall, and a second sidewall, each of the first sidewall and the second sidewall located on an opposite side of the body; the first sidewall defining a first receiving slot and a first positioning hole, and the second sidewall defining a second receiving slot and a second positioning hole; a first blocking piece extending from the first sidewall, and a second blocking piece extending from the second blocking piece; the first receiving slot located between the first blocking piece and the first positioning hole, and the second receiving slot located between the second blocking piece and the second positioning hole; and
a fan received in the body and secured to the second sidewall;
wherein the first positioning hole is aligned with the second positioning hole, and an area of the first receiving slot is larger than an area of the second receiving slot; when the first sidewall is placed on the ventilation plate and located between the second sidewall and the ventilation plate, the positioning post is engaged in the positioning hole, and the installation portion is received in the first receiving slot; when the second sidewall is placed on the ventilation plate and located between the first sidewall and the ventilation plate, the installation portion abuts a top surface of the second blocking piece substantially parallel to the ventilation plate, to prevent the positioning post from being engaged in the positioning hole, and prevent the installation portion from being received in the first receiving slot.

12. The fan assembly of claim 11, wherein the first side wall is substantially parallel to the second sidewall and the ventilation plate.

13. The fan assembly of claim 11, wherein a first positioning piece extend from the first sidewall, the first receiving slot and the first positioning hole are separated by the first positioning piece, and the first receiving slot is located between the first blocking piece and the first positioning piece; and the installation portion abuts an outer surface of the first blocking piece facing the first positioning piece when the first sidewall is placed on the ventilation plate and located between the second sidewall and the ventilation plate.

14. The fan assembly of claim 13, wherein the installation portion comprises an installation piece and a restricting piece, the installation piece extends from the positioning post, and the restricting piece abuts the outer surface of the first blocking piece.

15. The fan assembly of claim 14, wherein the restricting piece defines a cutout, and the first positioning piece is engaged in the cutout when the first sidewall is placed on the ventilation plate and located between the second sidewall and the ventilation plate.

16. The fan assembly of claim 14, wherein the cage further comprises a first side plate and a second side plate, the first side plate and the second side plate are substantially perpendicular to the ventilation plate and parallel to each other, and the installation piece is substantially parallel to the first side plate.

17. The fan assembly of claim 16, wherein the restricting piece obliquely extends from the installation piece towards the second side plate.

18. The fan assembly of claim 16, wherein a second blocking piece and a second positioning piece extend from the second sidewall, the second receiving slot and the second positioning hole is separated by the second positioning piece, and the second receiving slot is located between the second blocking piece and the second positioning piece.

19. The fan assembly of claim 18, wherein the first blocking piece and the second blocking piece are round, and a diameter of the first blocking piece is smaller than a diameter of the second blocking piece.

20. The fan assembly of claim 18, wherein the first sidewall defines an air inlet, the second sidewall defines an air outlet, the first blocking piece surrounds the air inlet, and the second blocking piece surrounds the air outlet; the air inlet and the air outlet are round, and a diameter of the air inlet is smaller than a diameter of the air outlet.

* * * * *